United States Patent [19]

Anderson et al.

[11] Patent Number: 5,457,718
[45] Date of Patent: Oct. 10, 1995

[54] COMPACT PHASE RECOVERY SCHEME USING DIGITAL CIRCUITS

[75] Inventors: Carl J. Anderson, Montrose; Albert X. Widmer, Katonah, both of N.Y.; Kevin R. Wrenner, Ridgewood, N.J.

[73] Assignee: International Business Machines Corporation, Armonk, N.Y.

[21] Appl. No.: 844,344

[22] Filed: Mar. 2, 1992

[51] Int. Cl.$^6$ .............................. H03D 3/24; H04L 7/02
[52] U.S. Cl. ........................................ 375/373; 375/376
[58] Field of Search ................................. 375/119, 120, 375/118, 103, 81, 106, 110, 371, 373, 375, 350, 359, 354; 307/511; 328/63, 108, 109, 133, 153

[56] References Cited

U.S. PATENT DOCUMENTS

| | | | |
|---|---|---|---|
| 3,908,115 | 9/1975 | Waggener | 375/81 |
| 4,414,676 | 11/1983 | Kraul et al. | 375/119 X |
| 4,831,338 | 5/1989 | Yamaguchi | 375/120 X |
| 4,868,524 | 9/1989 | Costlow et al. | 331/176 |
| 5,012,198 | 4/1991 | Okada et al. | 328/155 |
| 5,028,885 | 7/1991 | Voigt et al. | 375/120 |

OTHER PUBLICATIONS

EPO, 93100911.23 —Partial Search Report.
IBM Technical Disclosure Bulletin, vol. 31, No. 7, Dec. 1988, entitled "Feed–Forward Compensation Circuit for Digital Random–Walk Filters".

Primary Examiner—Stephen Chin
Assistant Examiner—Tesfaldet Bocure
Attorney, Agent, or Firm—Blaney Harper; Robert M. Trepp

[57] ABSTRACT

The present invention is a fully integrated digital filter which interacts with a phase comparator to provide a phase lock loop and data retiming function. The digital filter includes a prescaler, a six bit reversible counter, and a four bit reversible counter. The phase comparator is a D-type edge-triggered flip-flop in which an input data signal clocks the flip-flop and samples a clock signal to determine whether the clock signal leads or lags the input data signal. The clock signal is repeatedly sampled and the digital filter counts the number of leading and lagging signals. The digital filter counts the leading and lagging signals in groups so that the counting rate of the digital filter does not have to be as high as the input data rate. The prescaler groups the bits and the six bit counter determines the number of samples that indicate a clock lead or lag. The output of the six bit counter is the input to a four bit counter which provides a digital signal that controls the relative phase difference between the clock signal and the data signal. In a first implementation, the digital filter provides a data retiming function by sending the output of the four bit counter to a digital delay element interposed between the data signal input and the input to the phase comparator. When the data is out of phase with respect to a local clock, the digital filter determines from a multitude of binary phase decisions the polarity of phase correction required, and feeds this back to the delay element. The delay element then adjusts the phase of the incoming data with respect to the phase of the local clock. In a second implementation of the present invention, the digital filter provides a phase lock loop function by sending the output of the four bit counter to a digital to analog converter (DAC). The DAC adjusts the output frequency of a voltage controlled oscillator (VCO). The output of the VCO is the data input to the phase comparator and the data signal is the clock input to the phase comparator. The VCO output is compared to the data signal in order to adjust the frequency and phase of the VCO and generate the proper clock signal from the incoming data.

32 Claims, 11 Drawing Sheets

COMPACT PHASE RECOVERY SCHEME USING DIGITAL CIRCUITS

FIELD OF THE INVENTION

This invention relates generally to the field of semiconductor circuits. More particularly, this invention relates to a digital filter circuit. Specifically, this invention relates to a compact digital filter design and the integration of that design into data transmission circuits.

BACKGROUND OF THE INVENTION

Digital computing power increases as the ability to fabricate more electrical circuits in a smaller area increases. As a result, more data is sent to a single chip as more circuits are placed on a single chip. Additionally, the interconnection of many chips within a single computing system increases computing power. In sum, increasing computing power requires the ability to increase the amount of data processed by a single chip and the ability to interconnect many individual chips. One problem often associated with increasing the amount of data sent to a single chip and interconnecting many chips is that the computing system must be synchronized. That is, the processing of data must not only be coordinated between chips, but even within a single chip having multiple channels for communicating with other chips. This coordination of processing data is generally accomplished through the use of a system clock. Electrical circuits which process data use the system clock to coordinate their functions with other circuits in the computing system. Typically, the system clock is sent to all the chips in a computing system and is distributed to circuits within a single chip. However, variations in path lengths, and in driving and receiving circuits, introduce variations in delay of both data signals and in the distributed clock. These variations result in the clock signal being skewed in time with respect to the data signals. Therefore, some means for adjusting the phase of the received clock or data signal must be implemented to ensure that clock signals for various chips and data inputs are in phase with each other.

Traditionally, phase lock loops (PLLs) have been used to extract and adjust clock signals from data signals encoded with redundancy to allow clock regeneration at the receiver. In this way, no separate system clock need be distributed which results in no varying delays of system clocks. PLLs are desirable for this type of application because of their ability to reject noise. Filtering out noise is important for optimizing phase adjustment in the presence of jitter on the incoming signal. A second order PLL usually consists of a voltage controlled oscillator (VCO), a phase comparator and a low pass filter. The output of the phase comparator is the input to the low pass filter and the low pass filter output is the input to the VCO. A signal generated by the phase comparator adjusts the output frequency of the VCO to match the phase and frequency of the incoming data in order to generate a clock signal. The output of the VCO and the incoming data signal are the inputs to the phase comparator. Prior art designs which implement an analog loop filter use at least one discrete capacitor external to the integrated circuit. The problem with this implementation is that the external capacitor element can be the source of parasitic element and noise problems. Prior art designs which implement a digital loop filter, and so avoid the need for external components, typically do not operate fast enough. This is because the clock speed of the VCO is limited by the digital filter. The prior art has failed to implement a digital filter design which has no external components and which does not limit the clock speed of the PLL.

Digital filters are also useful for retiming mesochronous data. Mesochronous data has a baud rate which exactly matches the frequency of the clock, and has an indeterminate phase relationship to the clock signal. The mesochronous data retiming function is particularly useful when signal interconnections are long and system clock skew is high. Phase recovery is accomplished by adjusting the delay on the input data signal so that it may be retimed by the local clock. The adjustment of delay on all input data signals makes it possible that all circuits can operate with the same phase of the clock signal. Prior art attempts at data recovery have employed the technique of selecting the best of many clock phases to retime the data. Adjusting the clock phase rather than the data phase becomes impractical as the number of input data ports requiring phase recovery increases, since it is desirable to synchronize the processing of each input data bit. Prior art attempts to retime the data have also been very complicated. These complicated circuits consume a large amount of circuit area and power which limits the number of data paths which can be retimed on a single chip, thereby limiting the number of mesochronous interconnections that can be made to a single chip.

OBJECTS OF THE INVENTION

It is an object of the present invention to manufacture a fully integrated digital filter.

It is a further object of the present invention to manufacture a high speed fully integrated digital filter.

It is still another object of the present invention to manufacture a high speed circuit which generates the phase and frequency of a clock signal from data received by the digital circuit, so the data can be retimed to the clock.

It is still a further object of the present invention to manufacture a high speed and compact digital circuit which adjusts the phase of data that has a baud rate equal to the clock frequency, so the data can be retimed to the clock.

SUMMARY OF THE INVENTION

The present invention is a fully integrated digital filter which interacts with a phase comparator to provide a phase lock loop and data retiming function. The digital filter comprises a prescaler, a six bit reversible counter, and a four bit reversible counter. The phase comparator is a D-type edge-triggered flip-flop in which an input data signal clocks the flip-flop and samples a clock signal to determine whether the clock signal leads or lags the input data signal. The clock signal is repeatedly sampled and the digital filter counts the number of leading and lagging signals. The digital filter counts the leading and lagging signals in groups so that the counting rate of the digital filter does not have to be as high as the input data rate. The prescaler groups the bits and the six bit counter determines the number of samples that indicate a clock lead or lag. The output of the six bit counter is the input to a four bit counter which provides a digital signal that controls the relative phase difference between the clock signal and the data signal. In a first implementation, the digital filter provides a data retiming function by sending the output of the four bit counter to a digital delay element interposed between the data signal input and the input to the phase comparator. When the data is out of phase with respect to a local clock, the digital filter determines from a multitude of binary phase decisions the polarity of phase correction required, and feeds this back to the delay element. The delay element then adjusts the phase of the incoming data with respect to the phase of the local clock. In a second implementation of the present invention, the digital filter provides a phase lock loop function by sending the output of the four bit counter to a digital to analog converter (DAC). The DAC adjusts the output frequency of a voltage controlled oscillator (VCO). The output of the VCO is the data input to the phase comparator and the data signal is the clock input to the phase comparator. The VCO output is compared to the data signal in order to adjust the frequency and phase of the VCO and generate the proper clock signal from the incoming data.

DESCRIPTION OF THE PREFERRED EMBODIMENT

Figure 1:
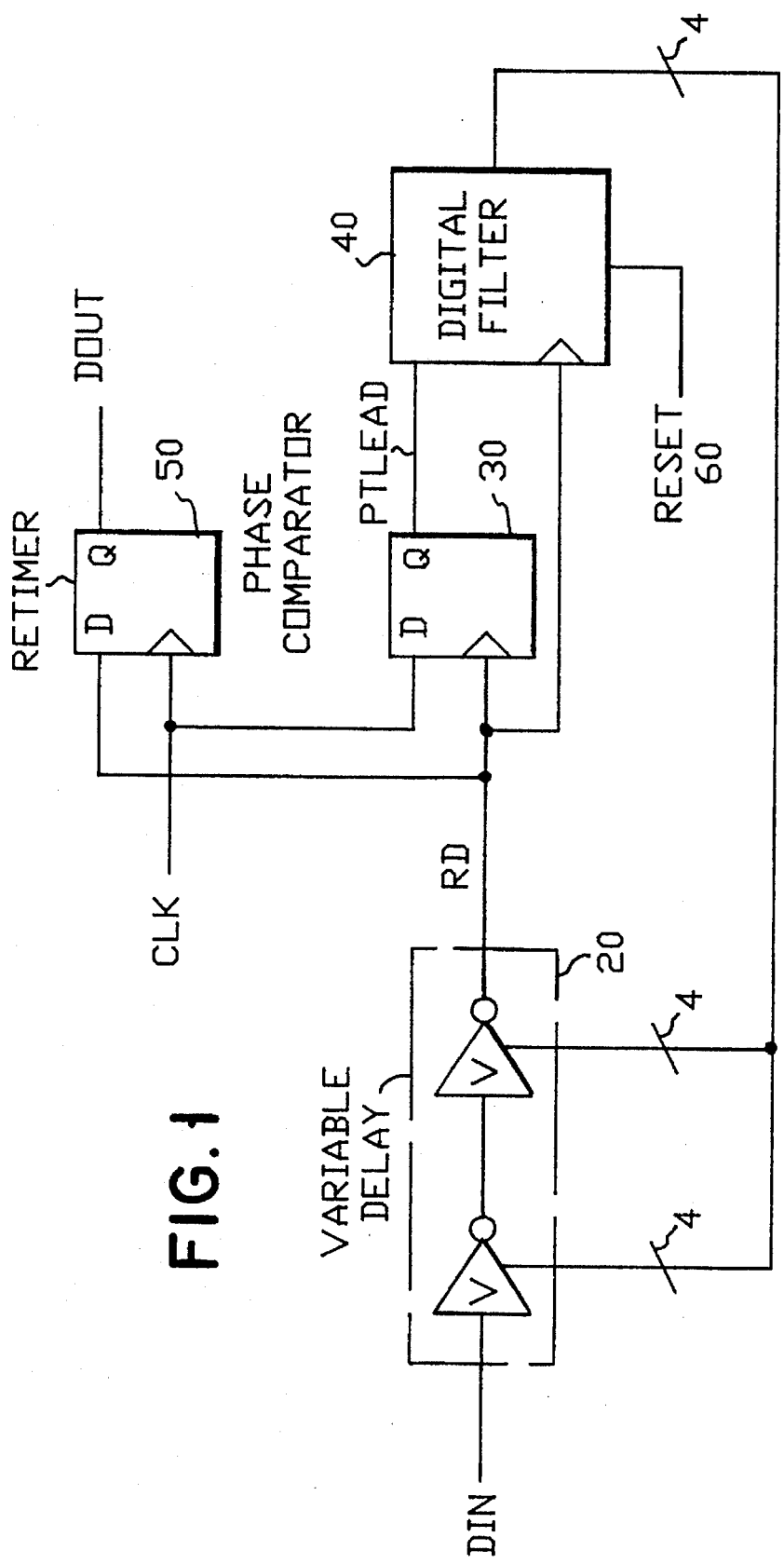
FIG. 1 illustrates a block diagram of a retiming circuit according to the present invention.

FIG. 1 illustrates a digital circuit for retiming a data input of an integrated circuit chip with respect to a local clock. The circuit illustrated in FIG. 1 combines a digital filter 40 with a phase comparator 30 and a variable delay element 20 to produce a compact circuit for retiming input data of an integrated circuit chip. The input data signal DIN has a known data baud rate but an arbitrary phase with respect to the locally distributed clock CLK. The data is delayed by delay element 20 to produce delayed data signal RD. A phase comparing flip-flop 30 is used to sample the phase of CLK at the falling edge of the delayed data RD. The output of phase comparator 30 PTLEAD and RD are the input to a digital filter 40. The output of the digital filter 40 controls the amount of delay that delay element 20 adds to the input data DIN. The adjustment of delay on the input data aligns transitions on RD with the rising edge of CLK. The retiming flip-flop 50 samples RD in the center of the baud interval using the falling edge of CLK. Output DOUT is then synchronous with the local clock CLK.

Figure 2:
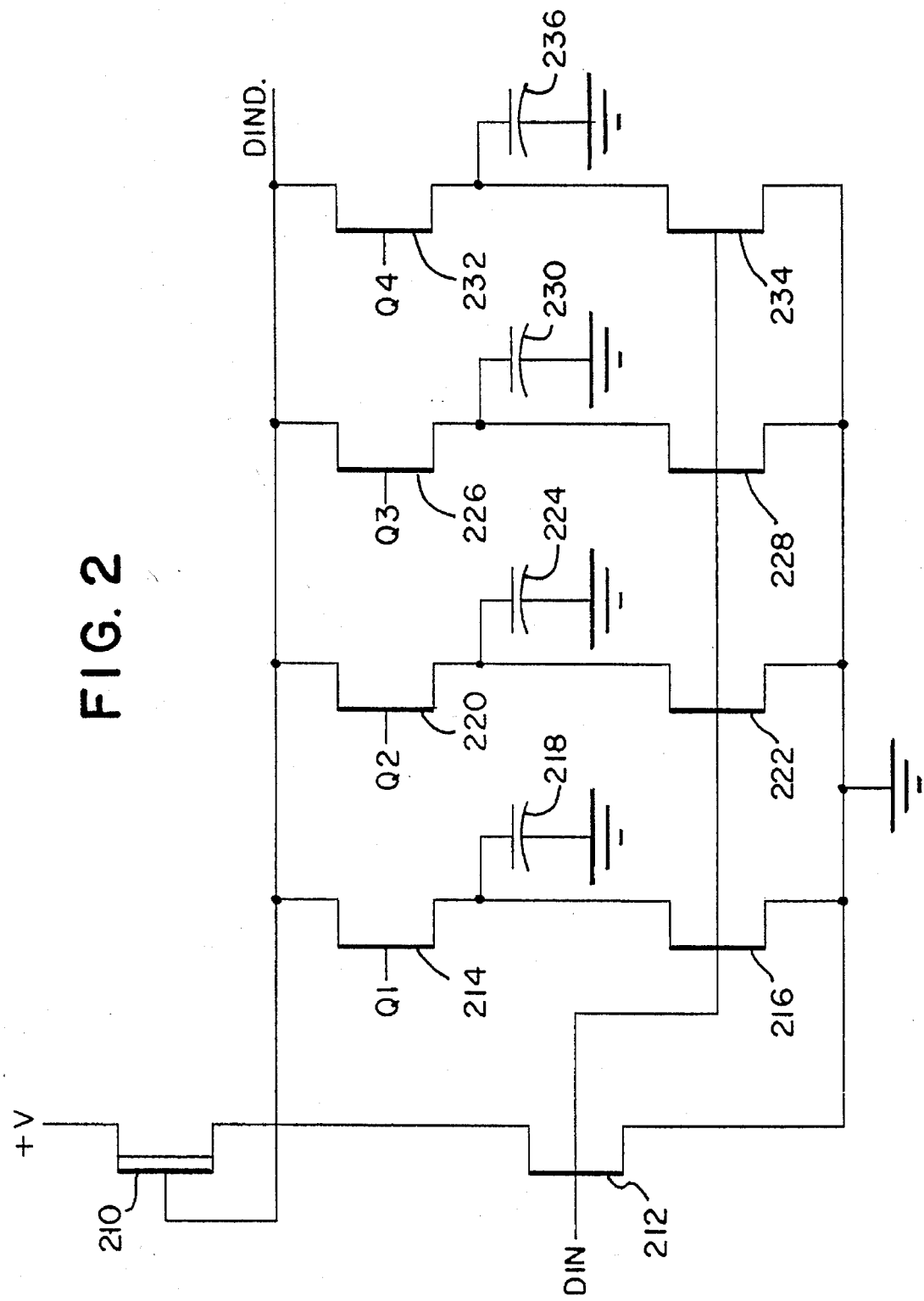
FIG. 2 illustrates a block diagram of the variable delay circuit of the present invention.

Data DIN is received by the variable delay element 20. FIG. 2 illustrates the diagram of the variable delay circuit, one or more of which connected in series comprises the variable delay element 20. A depletion mode transistor 210 and enhancement mode transistor 212 form an inverter between the power supply and ground. DIN is applied to the gate of transistor 212. The output of the variable delay circuit is a delayed version of the DIN signal. The delay of DIN is determined by transistors 214, 216, 220, 222, 226, 228, 232, and 234, as well as capacitors 218, 224, 230, and 236. The circuit is based on the AND-OR function where the AND function is implemented by placing two input transistors in series and the OR function is implemented by placing the AND functions in parallel. When any of the control inputs Q1–Q4, corresponding to the gate voltages of transistors 214, 220, 226, and 232 respectively, is a "1", the associated transistor will turn on and connect the associated capacitor to the output DIND, thereby adding to the delay from DIN to DIND. The lower transistors (216, 222, 228, and 234 respectively) will always be turned on when the input transistor 212 is on because the gates of the lower transistors are all connected to DIN. The lower transistors also discharge the capacitors 218, 224, 230, and 236. The range of delay for delay element 20 can be increased by adding more capacitors and their associated stacks of transistors, or by cascading variable delay circuits. The delay of RD from DIN is controlled digitally by the output of the digital filter 40.

Figure 3:
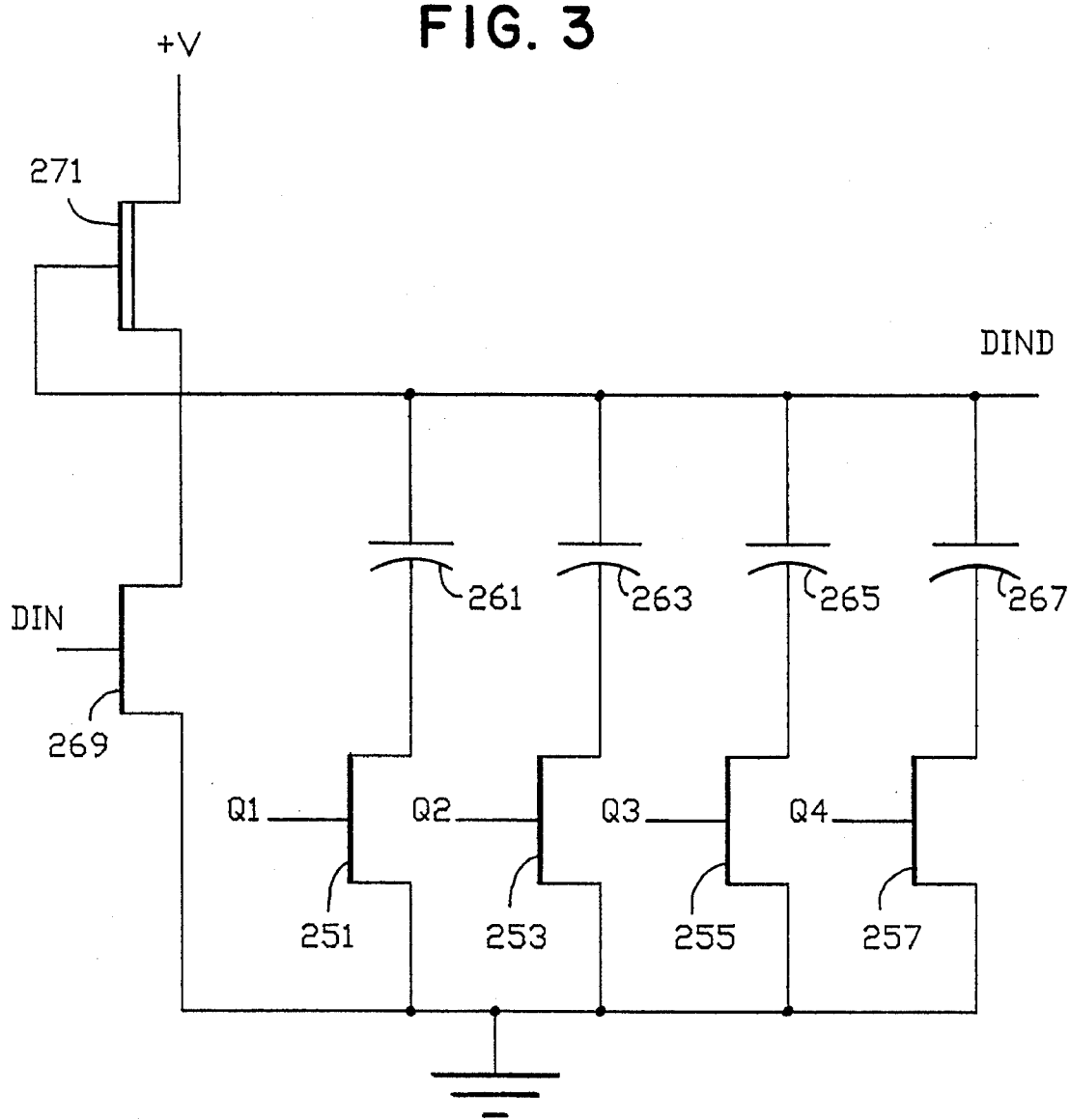
FIG. 3 illustrates an alternate embodiment of the variable delay circuit of the present invention.

FIG. 3 illustrates the diagram of an alternate embodiment of the variable delay circuit, one or more of which connected in series comprises the variable delay element 20. When any of the control inputs Q1–Q4 is a "1", the associated transistor 251–257 will turn on and connect the associated capacitor 261–267 to ground, thereby adding to the delay from DIN to DIND. DIN is an input to transistor 269 and one side of capacitors 261, 263, 265, and 267 is connected to the drain of transistor 269. The second side of the capacitors 261, 263, 265, and 267 is connected to transistors 251, 253, 255, and 257 respectively. The sources of transistors 251–257 are connected to ground and the gates are inputs Q1–Q4. The range of delay for the delay element 20 can be increased by adding more delay elements consisting of a series connection of a transistor and a capacitor, or by cascading variable delay circuits.

FIG. 1 illustrates that the delayed data RD is input into a phase comparator 30. Phase comparator 30 is a D-type falling edge-triggered flip-flop. The D flip-flop is clocked with the RD signal. The D input for the D flip-flop is the local clock signal CLK. In effect the D flip-flop samples the local clock signal at a rate determined by the transitions of RD. If the flip-flop output is a "1", then the local clock leads the RD signal. This is because if the D flip-flop is clocked on the falling edge of RD and if the output is a "1", then the CLK signal must have been a one when the RD was falling to zero. Similarly, if the output is a "0", then CLK lags RD. As a result, the D flip-flop functions as a binary phase comparator 30. If CLK and RD are closely enough aligned in phase such that the state of CLK is changing while being sampled by RD, then the phase comparator might produce an indeterminate result following a period of metastability. Such metastable results are effectively filtered because the output of the digital filter responds only to the average phase sample. The RD signal is an input to the digital filter 40 and the retiming flip-flop 50 in addition to being an input into the phase comparator.

Figure 4:
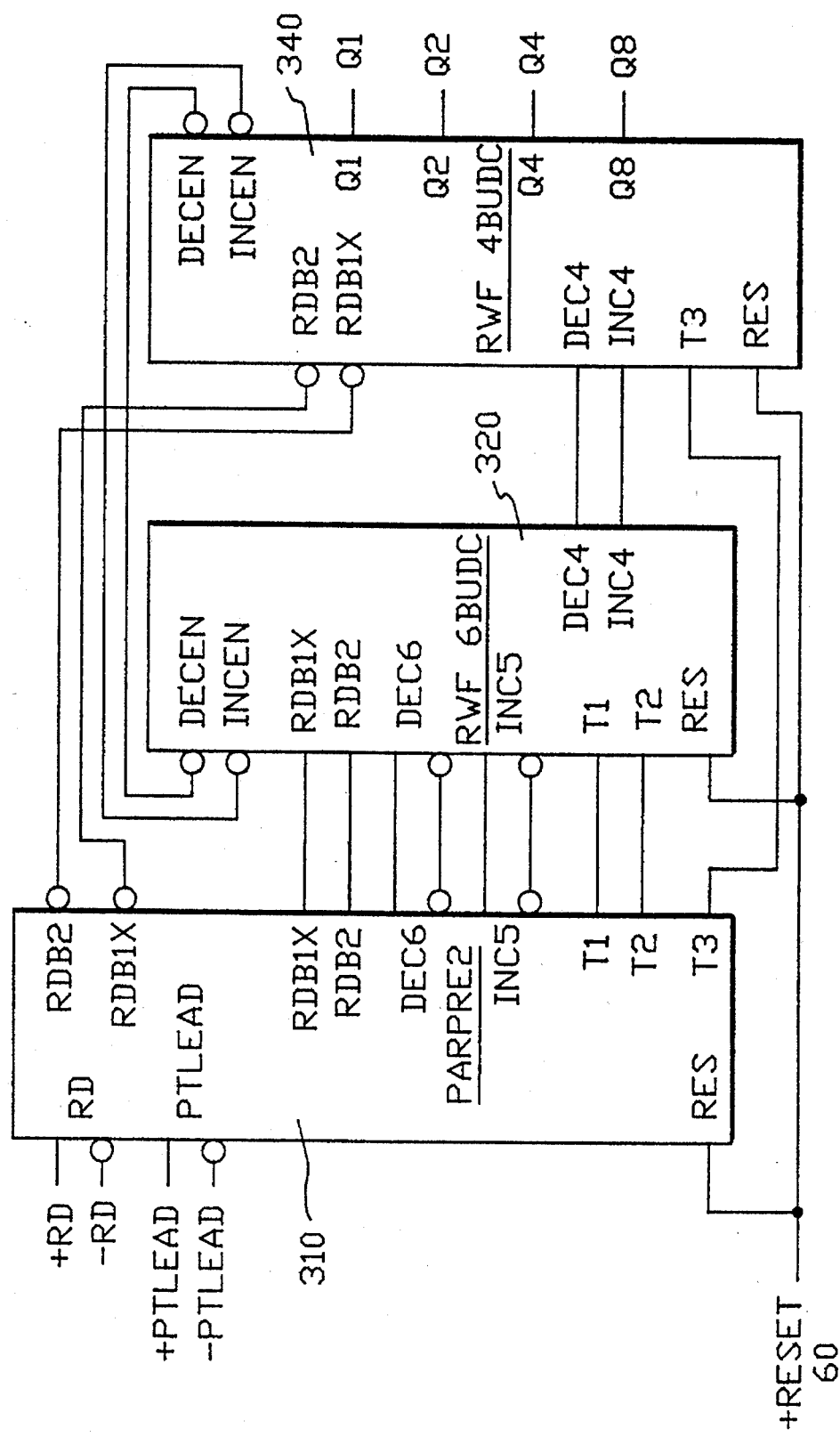
FIG. 4 illustrates a block diagram of the digital filter of the present invention.

Digital filter 40 is a fully integrated filter having a functional operation and compact design which lends itself to a variety of applications. The use of the digital filter 40 in the data retiming circuit of FIG. 1 is one of those applications. The output PTLEAD of the phase comparator 30 is one input to the digital filter 40. The other inputs are the RD signal and a reset line 60. FIG. 4 illustrates a block diagram of the digital filter 40. The output of the digital filter is a four bit control value for the variable delay element 20. The PTLEAD and RD signals are first sent to a prescaler 310. The function of the variable delay element 20 in the data retiming circuit is to adjust the delay of the DIN signal based on a digital count of PTLEAD signals made by the digital filter 40. However, a straight count of the PTLEAD signals would require an excessively high counting rate. Therefore, the prescaler 310 of the digital filter 40 groups the PTLEAD signals into groups of two by combinatorial logic and increments or decrements a counter 320. The prescaler 310 increments the counter 320 when PTLEAD has two sequential "1" states. The prescaler 310 decrements the counter 320 when PTLEAD has two sequential "0" states. The prescaler 310 does not increment or decrement when the group of two is a mixed "1" and "0" combination. The prescaler is not limited to reduction ratio of two; a ratio of four is required when the phase comparator samples on both positive and negative phase transitions.

Figure 5:
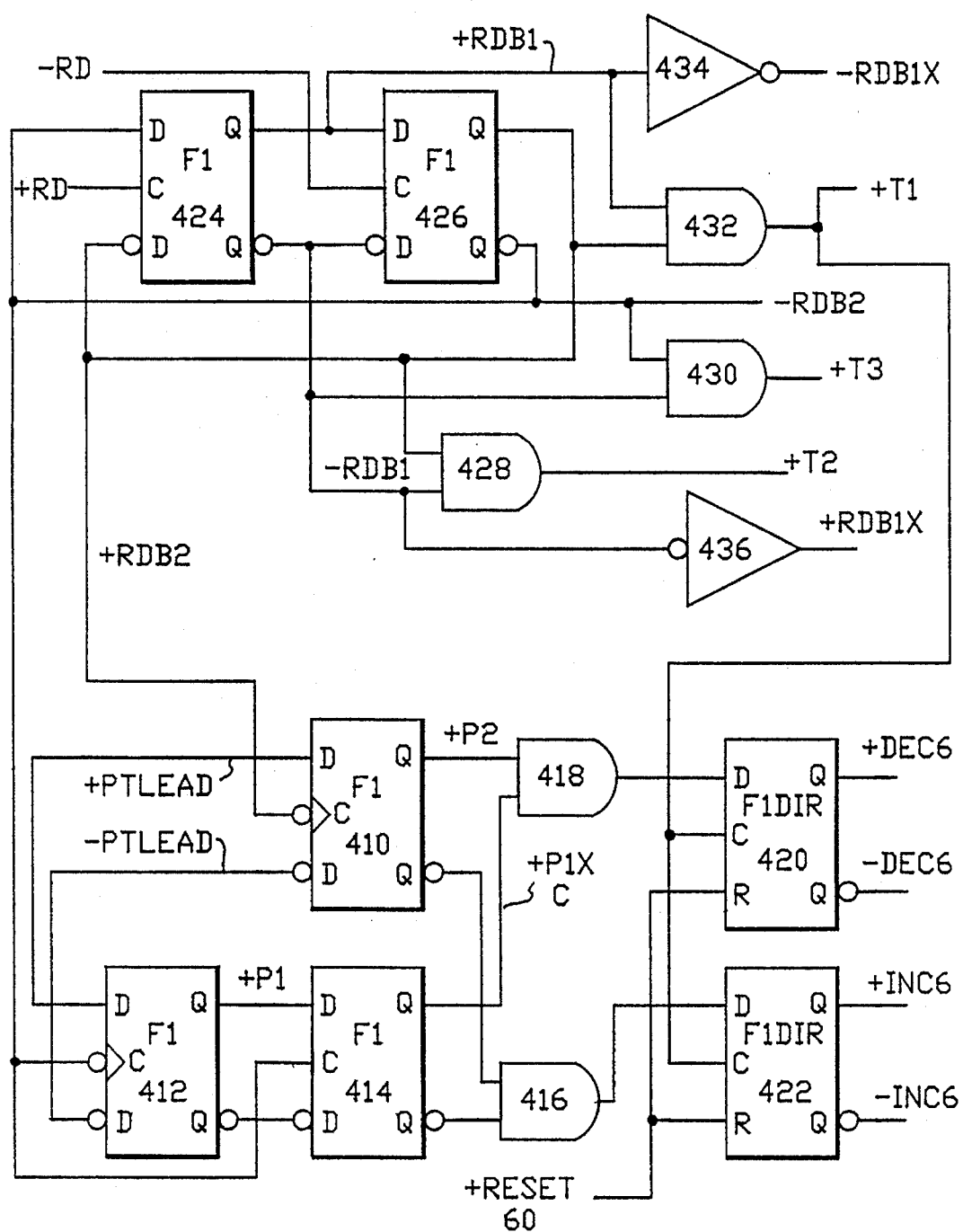
FIG. 5 illustrates a block diagram of a two bit prescaler of the present invention.
Figure 6A:
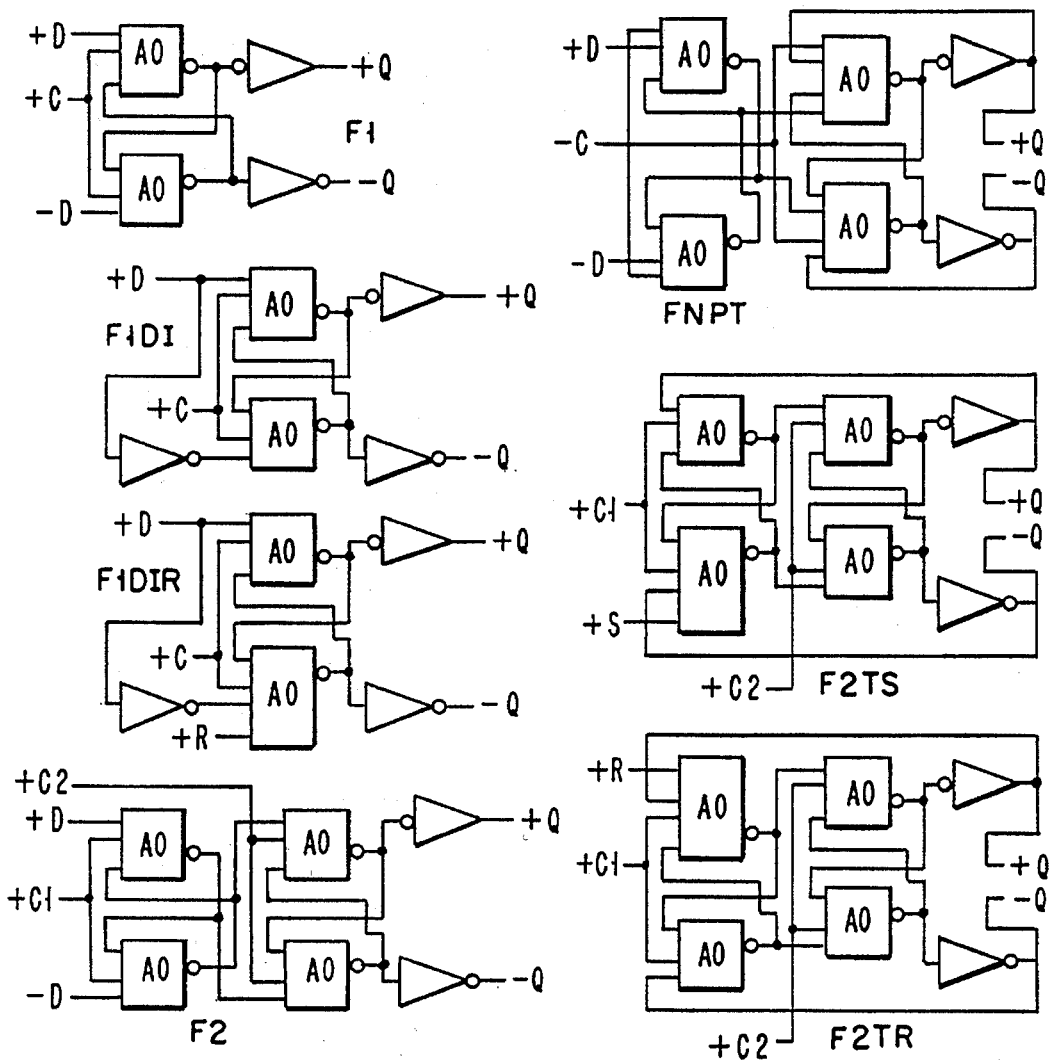
FIGS. 6a and 6b illustrate the circuit diagrams of the individual latches and flip-flops used in the present invention.
Figure 6B:
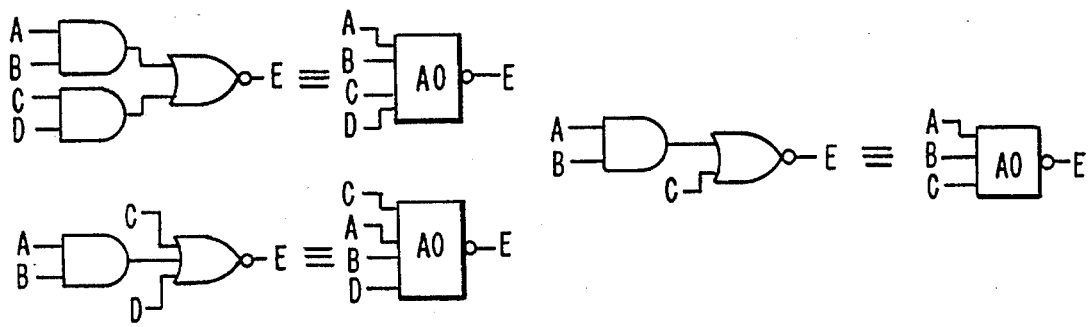

FIG. 5 is a logic diagram of the two bit prescaler used in the present invention. The top half of FIG. 5 also shows circuits which derive clock pulses from the data signal to step the counters at the proper rate and phase. These clocks are related to the transitions in the data signal, not the data rate. The rate of transitions is variable and depends on the data pattern. The use of the data signal for clocking purposes greatly simplifies the digital filter design, since the use of other available system clocks would entail complex synchronization problems. Additionally, a reference waveform external to the digital filter is not typically available to the digital filter in all the applications in which the digital filter 40 could be used. +PTLEAD and its complement are inputs into flip-flop 410. +RD is the input to latch 424 and its complement is the input to latch 426. FIG. 6(a) illustrates block diagrams of all the latches and flip-flops used in the digital filter 40. For example, the device F1 of FIG. 6(a) is device 424 in FIG. 5. FIG. 6(b) illustrates the AND-OR (AO) gates used in all the latches and flip-flops of FIG. 6(a). The reset line is an input to latches 420 and 422. The output of latches 420 and 422 are the increment and decrement signals (and their complements) sent to the six bit counter 320. The prescaler 310 also generates four clock signals T1–T4. These signals are used to clock the digital filter with a suitable phase at one half the arrival rate of positive transitions in the input signal RD. This rate varies with the data pattern. The four clocks are generated from the RD signal. FIG. 5 illustrates that RD clocks a first latch 424 and –RD clocks a second latch 426. The output of 424 is connected to the input of 426 and the complement of the output of 426 is connected to the input of 424.

Figure 7:
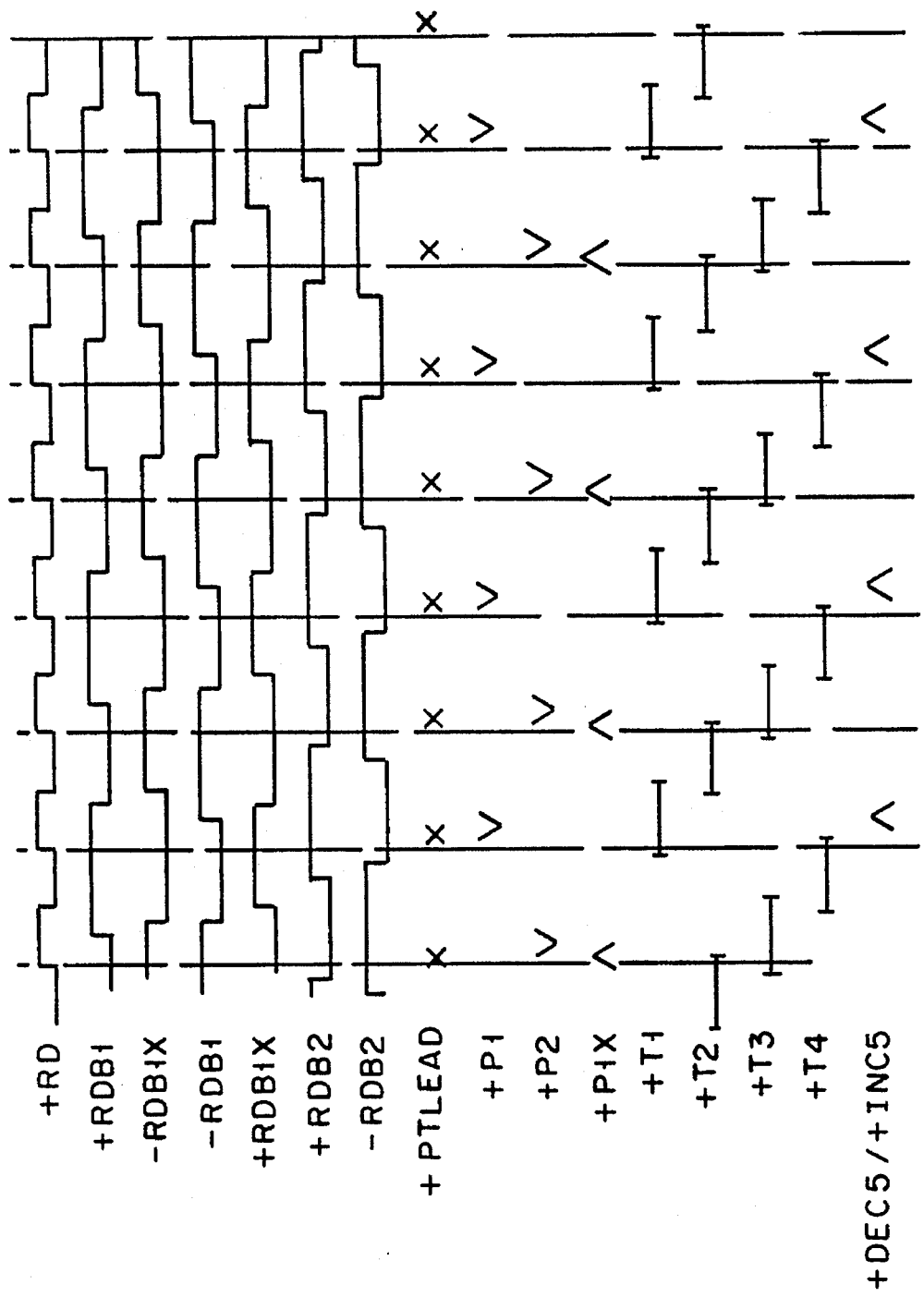
FIG. 7 illustrates the timing relationships between the clock signals generated in the prescaler of the present invention.

By performing the logical AND (^) function on the true and complement (') waveforms RDB1 and RDB2 one can generate four distinct pulses. For reference, we define the clock times T1=RDB1^RDB2, TD=RDB1'^RDB2, T3=RDB1'^RDB2', T4=RDB1^RDB2'. As an example, T3 and T1 clocks control the master and slave latches, respectively, of the six bit reversible counter of FIG. 9 as a pair of non-overlapping clocks. In order to reduce the delay associated with the clock pulses, the signals are not all produced as explicit clocks, but rather as part of a wider AND function. Wherever the AND of RDB1 and RDB2 (and complements) are performed, this is defined as being within one of the four clock intervals. The timing for the generated clocks is shown in FIG. 7. This timing is based on the assumption that each inversion generates a delay of approximately one quarter of a baud interval, or one eighth of a clock cycle. One baud interval is defined as the minimum nominal spacing of transitions in the input data disregarding jitter. RD is assumed to be alternating ones and zeros in FIG. 7 because this illustrates the tightest timing requirements. As illustrated in FIG. 7, T1 does not overlap with T3 and T2 does not overlap with T4.

Figure 8:
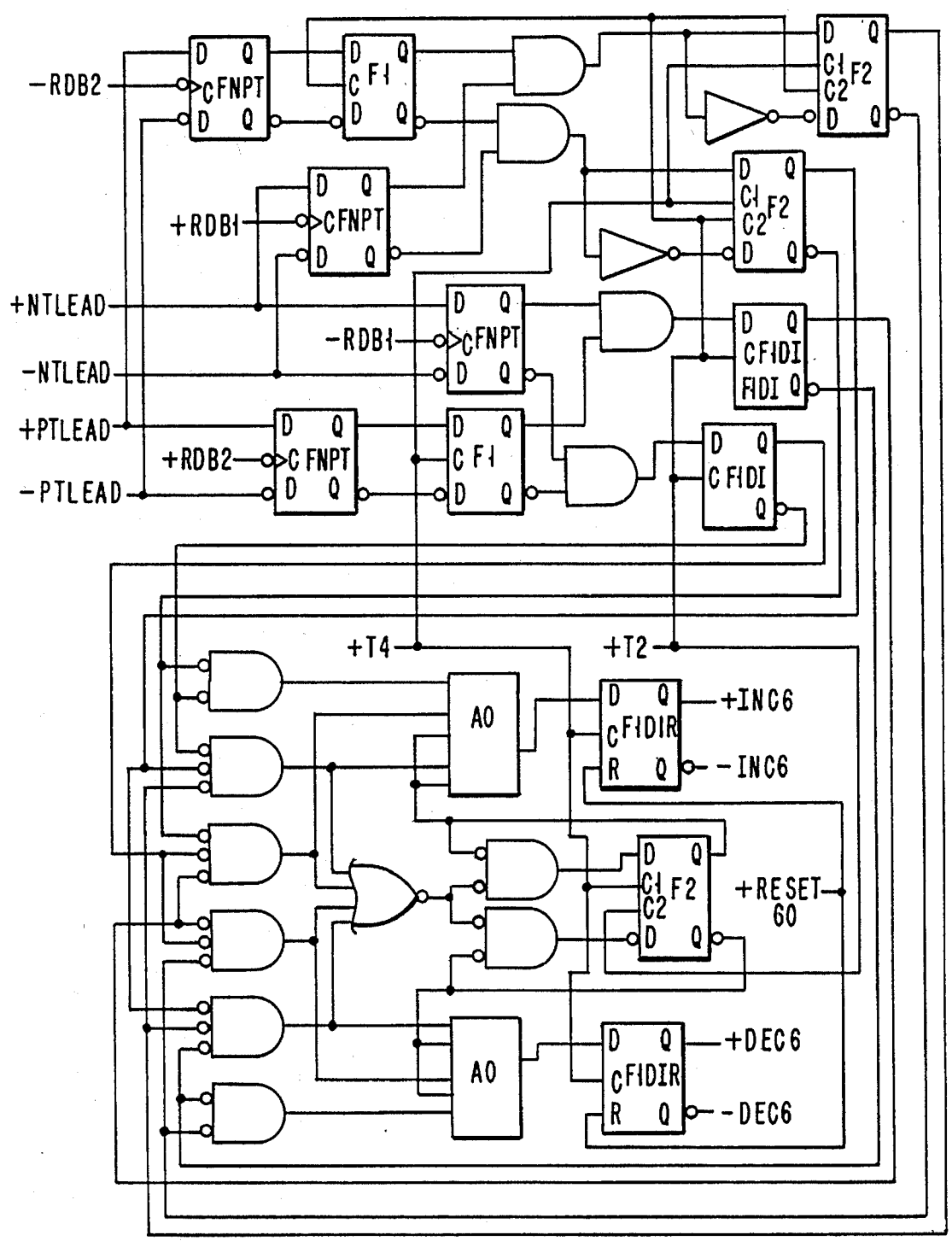
FIG. 8 illustrates a four bit prescaler for an alternate embodiment of the retiming circuit.

FIG. 8 illustrates the four bit prescaler which would be used in an alternate embodiment if the phase comparator sampled on both positive and negative phase transitions. The four timing pulses generated in the four bit prescaler are derived from RD in the same manner as in the two bit prescaler. The phase comparator 30 generates PTLEAD (and its complement). A second flip-flop similar to phase comparator 30 would generate NTLEAD (and its complement). The only difference between the second flip-flop and phase comparator 30 is that the complement of RD is the clock input rather than RD as in phase comparator 30. The PTLEAD and NTLEAD signals are sent to the four bit prescaler of FIG. 8. The output of the four bit prescaler has the same outputs (true and complement INC6 and DEC6) as the two bit prescaler.

Figure 9:
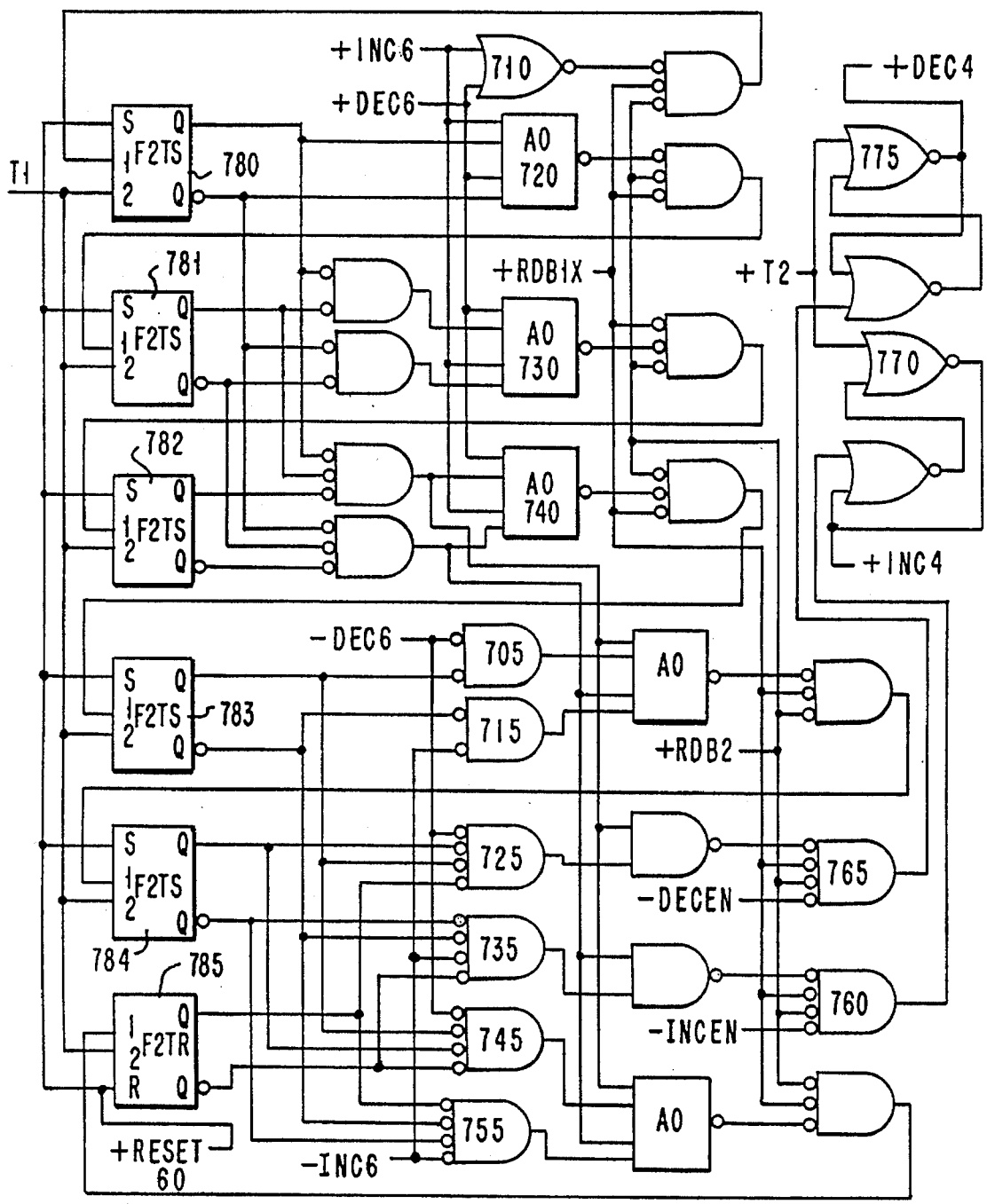
FIG. 9 illustrates a block diagram of the six bit counter of the present invention.

The prescaler 310 sends increment and decrement pulses to the six bit reversible counter 320. FIG. 9 illustrates the logic diagram for the counter 320. In general, the circuits have very short logic paths and small fan-outs. These constraints are added to maximize the timing margins between logic transitions in the circuits. The flip-flops F2TS which hold the counter state are toggle type; that is, their states are toggled when first the flip-flop's "1" input is pulsed high and then after an interval the "2" input is pulsed. The "1" inputs are pulsed high only when the a DEC6 (decrement) or INC6 (increment) signal is sent to the counter from the prescaler. INC6 and DEC6 signals are input into logic gates 710, 720, 730, and 740. The complement of the increment signal is an input of logic gates 715, 735, and 755. The complement of the decrement signal is an input of logic gates 705, 725, and 745. The complements of the increment enable and decrement enable signals are inputs of logic gates 760 and 765 respectively.

The principle of operation for the counter of FIG. 9 is as follows:

1. The low order bit (flip-flop 780) toggles unconditionally for every increment or decrement cycle.

2. When the counter is incremented, each of the higher order bits (781 to 785) toggles only if all the lower order bits are one, but toggling for the highest order bit (785) is suppressed, if it is a one.

3. When the counter is decremented, each of the higher order bits toggles only if all the lower order bits are zero, but toggling for the highest order bit is suppressed, if it is a zero.

4. During reset the counter is forced to a value of 011111.

The output of the six bit reversible counter is an increment or decrement signal sent to a four bit reversible counter. The four bit increment signal is the output of gate 770 and the four bit decrement signal is the output of gate 775. Clocks T1 and T2 are explicit inputs to the six bit counter 320. Clock T1 is an input to the slave latch of the six flip-flops 780–785 and clock T2 is an input to gates 770 and 775. T3 is an implicit input to the master latch of flip-flops 780–785. The counter 320 integrates the increment and decrement signals received from the prescaler 310. When 32 more increment signals than decrement signals have been sent to the six bit counter 320, the counter 320 sends an increment signal to a four bit counter 340 and resets itself to near its midpoint. When 32 more decrement signals than increment signals have been sent to the six bit counter 320, the counter 320 sends a decrement signal to a four bit counter 340 and resets itself to near its midpoint.

The bits representing the increments or decrements are stored in flip-flops 780, 781, 782, 783, 784, and 785. The bits are stored in order of priority in flip-flops 780–785 and flip-flop 785 stores the highest order bit and flip-flop 780 stores the lowest order bit. The reset line is used only to suppress counting and force a start-up from near the midpoint of both counters. For example, the reset function in the retiming circuit would be used to initiate phase recovery from near the center of the total range of delays. Also, in a second order phase lock loop (PLL) implementation of the digital filter (explained later), the reset function would initiate phase recovery following coarse adjustment of the VCO to near the right frequency by a means other than the PLL. When the six bit 320 counter of the present digital filter reaches an extreme point (i.e. 000000 or 111111) it does not roll over or wrap around. Instead, the high order bit is not complemented. That is, 111111 becomes 100000 and 000000 becomes 011111. In effect, on an increment beyond 63, approximately half the maximum count (=31) is subtracted, or on a decrement below 0, approximately half the maximum count (=31) is added. This feature of the counter is controlled by the wiring of gates 745 and 755.

Figure 10:
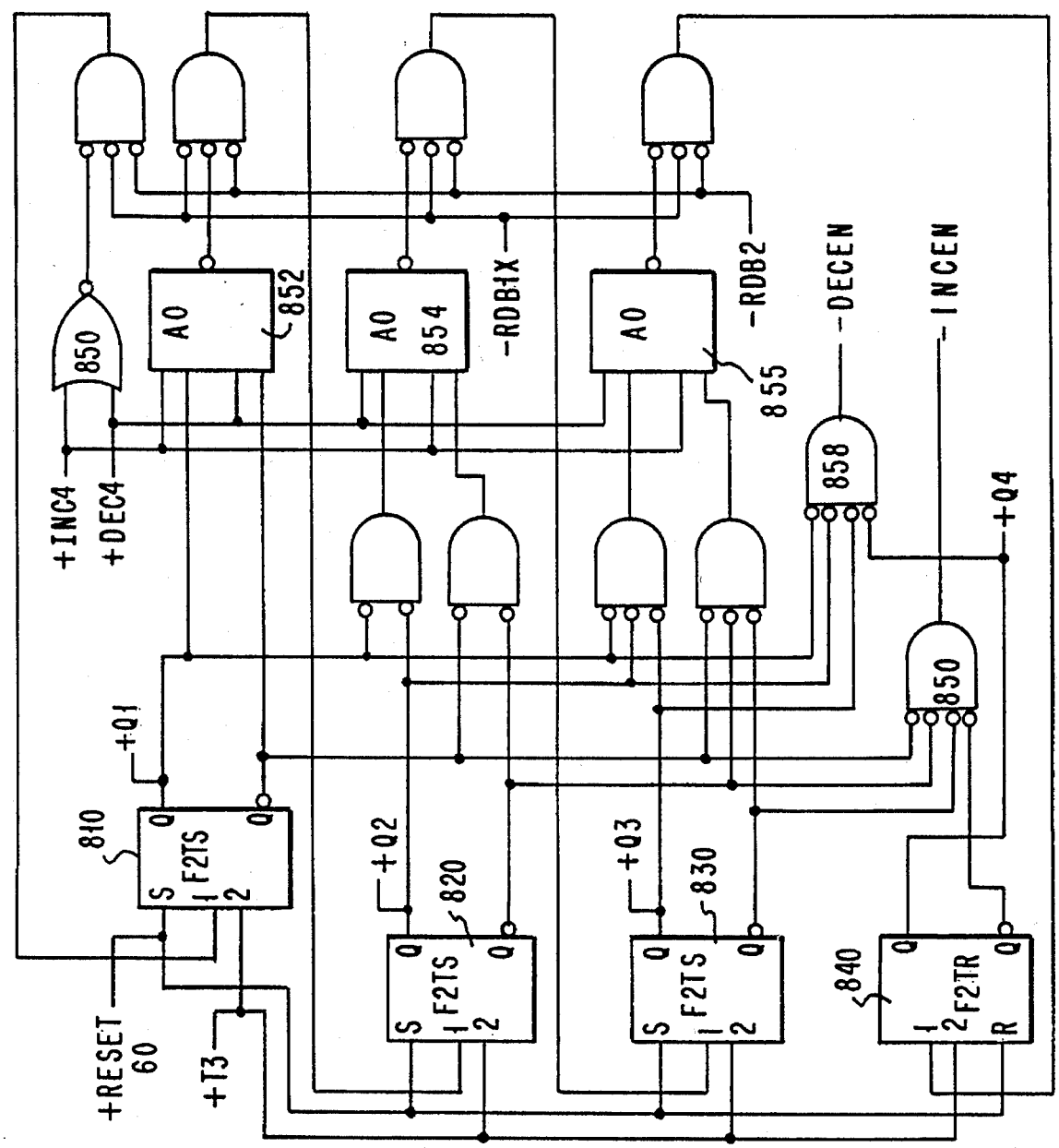
FIG. 10 illustrates a block diagram of the four bit counter of the present invention.

FIG. 4 illustrates that the output of the six bit counter 320 is sent to a four bit counter 340. The output of the four bit counter 340 controls the variable delay circuit 20. The four bit counter 340 is illustrated in FIG. 10.

The four bit counter 340 is incremented or decremented one step at a time after a plurality of 64 phase samples of one or the other polarity have been received, as shown by the outputs INC4 and DEC4 of the digital filter. The principle of operation for this counter is as follows:

1. When the counter is incremented, nothing happens if the existing counter state is all ones. Otherwise, the low order bit (flip-flop 810) toggles unconditionally, and any of the higher order bits (820, 830, 840) toggles only if all the lower order bits are one.

2. When the counter is decremented, nothing happens if the existing counter state is all zeros. Otherwise, the low order bit toggles unconditionally, and any of the higher order bits toggles only if all the lower order bits are zero.

3. During reset the counter is forced to a value of 0111.

The four counter bits, in order of priority from lowest to highest, are stored in flip-flops 810, 820, 830 and 840. The increment and decrement inputs are connected to logic gates 850, 852, 854, and 856. The complement of the decrement enable is the output of logic gate 858 and the complement of the increment enable is the output of logic gate 860. The clock T3 is an explicit input to the four bit counter 340 and is an input to the slave latch of flip-flops 810, 820, 830, and 840. The clock T1 is an implicit input to the master latch of the four flip flops 810–840. The reset line 60 is a set input of flip-flops 810, 820, and 830, and a reset input of flip-flop 840. The outputs Q1–Q4 of the four bit counter circuit 340 are the true outputs of flip-flops 810 (Q1), 820 (Q2), 830 (Q3), and 840 (Q4). The four bit counter has no overflow or wrap around capability. When an attempt is made to increment the four bit counter above 1111, its output does not change. Similarly, when an attempt is made to decrement the four bit counter below 0000, its output does not change. The outputs Q1–Q4 are connected to the control inputs of the variable delay element 20. When an increment or decrement causes any of Q1–Q4 to toggle, the delay of delay element 20 is increased or decreased accordingly.

The data retiming circuit of FIG. 1 operates to synchronize the incoming data to a local clock. The incoming data is transmitted to the retiming circuit at the baud rate corresponding to the frequency of the local clock. The local clock is the D input to a phase comparator flip-flop 30 which is clocked by a delayed version of the data in signal. If the falling edge of the delayed data signal RD latches a "1" then the clock leads the RD signal. If the falling edge of RD latches a "0" then the clock lags the RD signal. The number of lead or lag signals determines the delay adjustment made to the data signal DIN in order to adjust the phase of the incoming signal with respect to the local clock. The lead "1" signals and lag "0" signals are sent to the digital filter 40. The digital filter uses a prescaler 310 to assemble the lead and lag signals into groups of two. If a group has two lead signals, a six bit counter 320 is incremented. If the group has two lag signals, the six bit counter 320 is decremented. When the six bit counter has been incremented 32 times more than it has been decremented, a four bit counter 340 is incremented. When the six bit counter 320 has been decremented 32 times more than it has been incremented, the four bit counter 340 is decremented. The increment or decrement of the four bit counter controls the delay applied to DIN to develop the RD signal.

Figure 11:
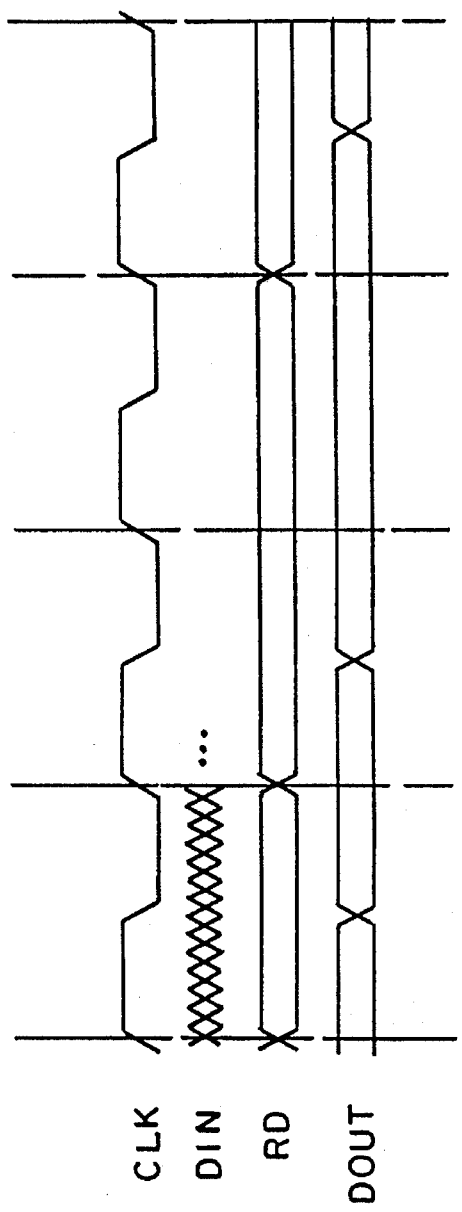
FIG. 11 illustrates the timing relationship between the input and output signals of the retiming circuit.

The RD signal is the data input to flip-flop 50 which is clocked by the local clock. The output of flip-flop 50 is then the retimed data out DOUT signal. The relative timing between the input and output signals of the retiming circuit is illustrated in FIG. 11. The RD waveform shows that the variable delay is adjusted such that the average position of transitions on RD is at the rising edge of the CLK signal. The DOUT waveform shows the RD signal retimed by flip-flop 50 (of FIG. 1) to the local clock. Retiming by adjusting the phase of the data in this manner, rather than by adjusting the phase of the clock, lends itself well to applications in which multiple inputs must be retimed. This is especially useful because the digital design of this circuit is compact enough to be replicated on each data port so as to retime each data port to the local clock.

Figure 12:
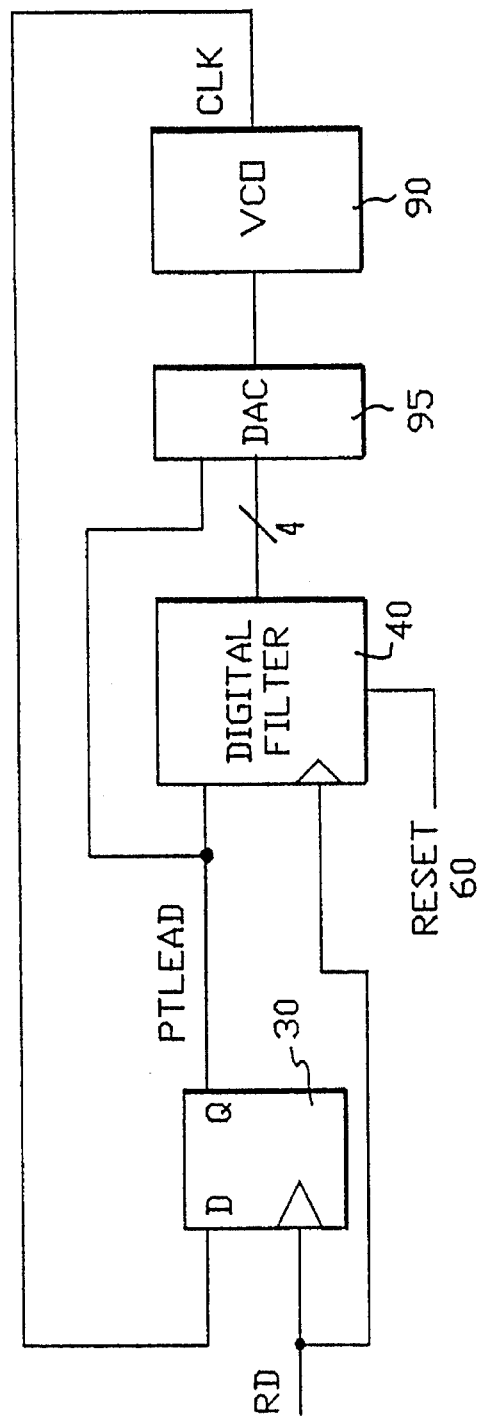
FIG. 12 illustrates a second order phase lock loop implemented with the fully integrated digital filter of the present invention.

The digital filter 40 of the data retiming circuit of FIG. 1 interacts with the phase comparator flip-flop 30 to provide an indication of the relative phase relationship between two signals. This same interaction between the digital filter and the phase comparator can also be used to design a fully digital phase lock loop in which the phase and frequency of a clock signal is extracted from an input data signal wherein the input data signal is encoded with redundancy to allow clock regeneration by the receiver. FIG. 12 illustrates a second order phase lock loop (PLL) which is fully integrated and utilizes this interaction between the digital filter and the phase comparator. The PLL uses a voltage controlled oscillator (VCO) in which the output frequency is controlled by varying a bias current with a digital to analog converter (DAC). The DAC has four bits which control the fine adjustment of the VCO frequency. Coarse adjustment of the VCO frequency can be controlled by a current supply having sufficient magnitude. The input to the DAC is from a digital filter which samples the lead or lag signals from a phase comparator. The digital filter and the phase comparator are the same circuit elements used in the retiming circuit.

FIG. 12 illustrates that the input data signal to the PLL is RD. RD is the clock input to phase comparator 30 which is a D-type edge triggered flip-flop having its D input connected to the output of a voltage controlled oscillator (VCO)

90. The output of the D flip-flop 30 (which is the phase sample PTLEAD) is one input to the digital filter 40. The other two inputs to the digital filter 40 are the RD signal and the reset line 60. The output of the digital filter 40 is a four bit digital signal which is applied to the input of a digital to analog converter (DAC) 95. The second input to the DAC 95 is PTLEAD. PTLEAD is used to stabilize the PLL because the PLL is not unconditionally stable. The digital filter behaves to first order like an ideal integrator, and the VCO also behaves like an ideal integrator, so the PLL contains two poles at low frequency. Using PTLEAD as a feed-forward signal sets the damping of the PLL and makes the PLL stable. The DAC 95 converts the digital signal to an analog current signal which drives the VCO 90. The output of the VCO is a clock signal having the phase and frequency characteristics of the clock signal coded into the input data.

The digital filter 40 comprises a prescaler 310, a six bit reversible counter 320, and a four bit reversible counter 340. The prescaler and counters operate in the same manner as in the retiming circuit of FIG 1. The lead and lag signals are grouped in groups of two or four (depending on whether the prescaler is a two bit or a four bit implementation), and the combination of the group determines whether the six bit counter is incremented or decremented. When the six bit counter 320 has been incremented 32 more times than decremented, a four bit counter 340 is incremented and the counter 320 is reset to 32, near its midpoint. When counter 320 has been decremented 32 more times than incremented, counter 340 is decremented and counter 320 is reset to 31, near its midpoint. The output of counter 340 is a four bit value which is the input to a DAC 95. DAC 95 is a conventional four bit DAC which generates a control signal within the operating range of the VCO 90. The VCO 90 is a conventional VCO which generates an oscillating clock signal having a frequency within the range of the frequency of the RD signal. The output of the VCO is the recovered clock from the RD signal. The output of the VCO is also the feedback to the phase comparator 30. When the output of flip-flop 30 is a one then the output of the VCO leads the RD signal and when the output of flip-flop 30 is a zero then the output of the VCO lags the RD signal. A phase sample indicating a leading or lagging clock phase is the input to the digital filter 40. The digital filter determines from a multitude of binary phase decisions the polarity of phase correction required, and adjusts the frequency and phase of the VCO via a digital signal which is sent to the DAC. The DAC sends an analog signal, here a current bias, to the VCO which corresponds to the digital input. Even though a digital filter is used in this design, the operation and overall function of this digital PLL is equivalent to a standard analog PLL. The key parameters of VCO stability, loop bandwidth, and loop gain are chosen as in any conventional PLL. The resulting output of the VCO which is fed back to the phase comparator is the clock signal CLK extracted from RD.

While this invention has been described with respect to several particular embodiments, it would be understood by those skilled in the art that changes in the above description or illustrations may be made with respect to form or detail without departing from the spirit or scope of the invention.

Having thus described our invention what we claim as new and desire to secure as Letters Patent, is:

1. A digital filter, comprising:

a prescaler means for grouping a plurality of digital pulses into a plurality of groups of digital pulses, each of said plurality of groups of digital pulses having an identical number of digital pulses, said prescaler generates a plurality of first increment or first decrement signals from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal; and a counter means coupled to said prescaler means for counting said first increment and decrement signals generated by said prescaler and generating a digital signal output corresponding to said count of said first increment and decrement signals.

2. A digital filter, as in claim 1, wherein:

said prescaler means groups said plurality of digital pulses into groups of two digital pulses; and said prescaler means generates a first increment signal when two digital pulses in one of said plurality of groups of digital pulses have a first polarity and said prescaler means generates a first decrement signal when two of said digital pulses in one of said plurality of groups of digital pulses have a second polarity.

3. A digital filter, as in claim 1, wherein:

said counter means comprises a first counter means for counting said first increment and decrement signals from said prescaler means and a second counter means for generating said digital signal output;

said prescaler means increments said first counter means when said prescaler means generates a first increment signal said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

4. A digital filter, as in claim 1, wherein:

said prescaler means groups said plurality of digital pulses into groups of four digital pulses.

5. A digital filter, as in claim 2, wherein:

said counter means comprises a first counter means for counting said first increment and decrement signals from said prescaler means and a second counter means for generating said digital signal output;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

6. A digital filter, as in claim 4, wherein:

said counter means comprises a first counter means for counting said first increment and decrement signals from said prescaler means and a second counter means for generating said digital signal output;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

7. A process for filtering a digital signal, comprising:

grouping a plurality of digital pulses into a plurality of groups of digital pulses, each of said plurality of groups of digital pulses having an identical number of digital pulses;

generating a plurality of first increment or decrement signals from said plurality of groups of digital pulses, said generation of an increment pulse occurs when one of said plurality of groups of digital pulses indicates that the phase of a local clock signal leads the phase of an input data signal to said digital filter, said generation of a decrement pulse occurs when one of said plurality of groups of digital pulses indicates that the phase of said local clock signal lags the phase of said input data signal;

counting said first increment and decrement signals; and generating a digital output signal corresponding to said count of said first increment and decrement signals.

8. A process for filtering a digital signal, as in claim 7, wherein:

each of said plurality of groups of digital pulses has two digital pulses; and said first increment signal is generated when two digital pulses in one of said plurality of groups of digital pulses have a first polarity, and said first decrement signal is generated when two digital pulses in one of said plurality of groups of digital pulses have a second polarity.

9. A process for filtering a digital signal, as in claim 7, further comprising:

generating a second increment and decrement signal from said counting of said first increment and decrement signals, said second increment signal is generated when said counting of said first increment and decrement signals counts greater than a first counter limit, said second decrement signal is generated when said counting of said first increment and decrement signals counts lower than a second counter limit;

counting said second increment and decrement signals; and generating said digital signal output from said second increment and decrement signals.

10. A process for filtering a digital signal, as in claim 7, wherein:

each of said plurality of groups of digital pulses has four digital pulses.

11. A process for filtering a digital signal, as in claim 8, further comprising:

generating a second increment and decrement signal from said counting of said first increment and decrement signals, said second increment signal is generated when said counting of said first increment and decrement signals counts greater than a first counter limit, said second decrement signal is generated when said counting of said first increment and decrement signals counts lower than a second counter limit;

counting said second increment and decrement signals; and generating said digital signal output from said second increment and decrement signals.

12. A process for filtering a digital signal, as in claim 10, further comprising:

generating a second increment and decrement signal from said counting of said first increment and decrement signals, said second increment signal is generated when said counting of said first increment and decrement signals counts greater than a first counter limit, said second decrement signal is generated when said counting of said first increment and decrement signals counts lower than a second counter limit;

counting said second increment and decrement signals; and generating said digital signal output from said second increment and decrement signals.

13. A retiming circuit for synchronizing a digital input signal with a local clock, comprising:

a delay means for delaying said digital input signal which is responsive to a digital control signal wherein said digital control signal controls a delay added to said digital input signal;

a phase comparator means connected to said delay means and said local clock for comparing a phase of said local clock with a phase of said delayed input signal and generating a digital phase comparator signal which corresponds to said phase comparison; and a digital filter connected to said phase comparator and to said delay means for controlling said delay means, said digital filter generates said digital control signal for said delay means in response to said phase comparator signal;

said digital filter comprises a prescaler means for grouping a plurality of digital pulses into a plurality of groups of digital pulses, each of said plurality of groups of digital pulses having an identical number of digital pulses, said prescaler generates a plurality of first increment or first decrement signals from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal; and a counter means coupled to said prescaler means for counting said first increment and decrement signals generated by said prescaler and generating said digital control signal corresponding to said count of said first increment and decrement signals.

14. A retiming circuit, as in claim 13, wherein:

said prescaler means groups said plurality of digital pulses into groups of two digital pulses; and said prescaler means generates a first increment signal when two digital pulses in one of said plurality of groups of digital pulses have a first polarity and said prescaler means generates a first decrement signal when two of said digital pulses in one of said plurality of groups of digital pulses have a second polarity.

15. A retiming circuit, as in claim 13, wherein:

said counter means comprises a first counter means for counting said first increment and decrement signals from said prescaler means and a second counter means for generating said digital control signal;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

16. A retiming circuit, as in claim 13, wherein:

said prescaler means groups said plurality of digital pulses into groups of four digital pulses.

17. A retiming circuit, as in claim 14, wherein:

said counter means comprises a first counter means for counting said first increment and decrement signals from said prescaler means and a second counter means for generating said digital control signal;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

18. A retiming circuit, as in claim 16, wherein:

said counter means comprises a first counter means for counting said first increment and decrement signals from said prescaler means and a second counter means for generating said digital control signal;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

19. A phase lock loop, comprising:

a phase comparator connected to a digital filter and a digital to analog converter, said phase comparator having a digital data input signal and a digital phase input signal from a voltage controlled oscillator, said phase comparator generates a digital phase comparator signal which corresponds to a phase difference between said digital data input signal and said digital phase input signal;

said digital filter having said digital data input signal, said phase comparator transmits said phase comparator signal to said digital filter, said digital filter generates a digital control signal from said phase comparator signal and said digital data input signal;

said digital to analog converter being connected to said digital filter, said phase comparator, and said voltage controlled oscillator, said phase comparator transmits said phase comparator signal to said digital to analog converter, said digital filter transmits said digital control signal to said digital to analog converter, said digital to analog converter converts said digital control signal to an analog control signal to control said voltage controlled oscillator, said digital to analog converter transmits said analog control signal to said voltage controlled oscillator, said voltage controlled oscillator generates said digital phase input signal having a frequency corresponding to said analog control signal;

said voltage controlled oscillator transmits said digital phase input signal to said phase comparator;

said digital filter comprises a prescaler means for grouping a plurality of digital pulses into a plurality of groups of digital pulses, each of said plurality of groups of digital pulses having an identical number of digital pulses, said prescaler generates a plurality of first increment or first decrement signals from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal; and a counter means coupled to said prescaler means for counting said first increment and decrement pulses generated by said prescaler and generating a digital control signal corresponding to said count of said first increment and decrement signals.

20. A phase lock loop, as in claim 19, wherein:

said prescaler means groups said plurality of digital pulses into groups of two digital pulses; and said prescaler means generates a first increment signal when two digital pulses in one of said plurality of groups of digital pulses have a first polarity and said prescaler means generates a first decrement signal when two of said digital pulses in one of said plurality of groups of digital pulses have a second polarity.

21. A phase lock loop, as in claim 19, wherein:

said counter means comprises a first counter means for counting said first increment and decrement signals from said prescaler means and a second counter means for generating said digital control signal;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

22. A phase lock loop, as in claim 19, wherein:

said prescaler means groups said plurality of digital pulses into groups of four digital pulses.

23. A phase lock loop, as in claim 20, wherein:

said counter means comprises a first counter means for counting said first increment and decrement signals from said prescaler means and a second counter means for generating said digital control signal;

said prescaler means increments said first counter means when said prescaler means generates a first increment signal, said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

24. A phase lock loop, as in claim 22, wherein:

said counter means comprises a first counter means for counting said first increment and decrement signals from said prescaler means and a second counter means for generating said digital control signal;

said prescaler means increments said first counter means when said prescaler means generates a first increment signal said prescaler means decrements said first counter means when said prescaler generates a first decrement signal;

said first counter means generates a second increment signal when said first counter means counts higher than a first counter limit, said first counter means generates a second decrement signal when said first counter means counts lower than a second counter limit; said first counter means is reset to an intermediate value when said first counter means is greater than said first counter limit, said first counter means is reset to an intermediate value when said first counter means is less than said second counter limit; and said second increment signal increments said second counter means and said second decrement signal decrements said second counter means.

25. A clock generator circuit for generating timing pulses from an input data signal, comprising:

a first latch having said input data signal as an input;

a first complement means for complementing said input data signal;

a second latch having a complement of said input data signal as an input, an output from said first latch forming a second input to said second latch;

a second complement means for complementing an output from said second latch and an output from said first latch;

said complement output from said second latch forms a second input to said first latch;

a first logical AND gate having said output of said first latch and said output of said second latch as inputs wherein an output from said first AND gate forms a first timing pulse;

a second logical AND gate having said complement output from said second latch and a complement output from said first latch as inputs wherein an output from said second AND gate forms a third timing pulse, said third timing pulse does not overlap said first timing pulse;

a third logical AND gate having said complement output of said first latch and said output of said second latch as inputs wherein an output of said third logical AND gate forms a second timing pulse; and a fourth logical AND gate having said output of said first latch and said complement output of said second latch as inputs wherein an output from said fourth AND gate forms a fourth timing pulse, said fourth timing pulse does not overlap said second timing pulse.

26. A process for generating four timing pulses from a digital data input signal, comprising:

complementing said data input signal;

combining an output from a first latch and an output from a second latch in an AND function to form a first timing pulse wherein said first latch has a digital data input signal as a first input, complementing said first and second latch outputs, said second latch has said complement of said digital data input signal as a first input, said complement output of said second latch connected to a second input of said first latch, and said first latch having an output connected to a second input of said second latch;

combining a complement output from said first latch and a complement output from said second latch in an AND function to form a third timing pulse wherein said first timing pulse and said third timing pulse do not overlap;

combining a complement output from said first latch and an output from said second latch in an AND function to form a second timing pulse; and combining an output from said first latch and a complement output from said second latch in an AND function to form a fourth timing pulse wherein said second timing pulse and said fourth timing pulse do not overlap.

27. A digital filter, comprising:

a clock generator circuit for generating four timing pulses from an input data signal;

a prescaler means for grouping a plurality of digital pulses into a plurality of groups of digital pulses, each of said plurality of groups of digital pulses having two digital pulses, said prescaler generates a plurality of first increment or first decrement signals from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal, said prescaler means being updated by a first timing pulse from said clock generator circuit;

a first counter means coupled to said prescaler means for counting said first increment and decrement pulses generated by said prescaler, said first counter means having master and slave latches, said master latches being updated by a third timing pulse generated from said clock generator circuit and said slave latches being updated from said first timing pulse, said first and third timing pulses do not overlap; and a second counter means coupled to said first counter means for generating a digital signal output corresponding to said count of said first increment and decrement signals, said second counter means having master and slave latches, said master latches of said second counter means being updated by said first timing pulse and said slave latches of said second counter means being updated by said third timing pulse.

28. A digital filter, comprising:

a clock generator circuit for generating four timing pulses from an input data signal;

a prescaler means for grouping a plurality of digital pulses into a plurality of groups of digital pulses, each of said plurality of groups of digital pulses having four digital pulses, said prescaler generates a plurality of first increment or first decrement signal from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal, said prescaler means being updated by a fourth timing pulse from said clock generator circuit;

a first counter means coupled to said prescaler means for counting said first increment and decrement pulses generated by said prescaler, said first counter means having master and slave latches, said master latches being updated by a second timing pulse generated from said clock generator circuit and said slave latches being updated from said fourth timing pulse, said second and fourth timing pulses do not overlap; and a second counter means coupled to said first counter means for generating a digital signal output corresponding to said count of said first increment and decrement signals, said second counter means having master and slave latches, said master latches of said second counter means being updated by said fourth timing pulse and said slave latches of said second counter means being updated by said second timing pulse.

29. A retiming circuit for synchronizing a digital input signal with a local clock, comprising:

a delay means for delaying said digital input signal which is responsive to a digital control signal wherein said digital control signal controls a delay added to said digital input signal;

a phase comparator means connected to said delay means and said local clock for comparing a phase of said local clock with a phase of said delayed input signal and generating a digital phase comparator signal which corresponds to said phase comparison; and a digital filter connected to said phase comparator and to said delay means for controlling said delay means, said digital filter generates said digital control signal for said delay means in response to said phase comparator signal, said digital filter includes a clock generator circuit, a prescaler means, a first counter means, and a second counter means, said clock generator circuit generates four timing pulses from said delayed input data signal;

said prescaler means groups a plurality of digital pulses from said phase comparator into a plurality of groups of digital pulses, each of said plurality of groups of digital pulses having two digital pulses, said prescaler generates a plurality of first increment or first decrement signal from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal, said prescaler means being updated by a first timing pulse from said clock generator circuit;

said first counter means coupled to said prescaler means counts said first increment and decrement pulses generated by said prescaler, said first counter means having master and slave latches, said master latches being updated by a third timing pulse generated from said clock generator circuit and said slave latches being updated from said first timing pulse, said first and third timing pulses do not overlap; and said second counter means coupled to said first counter means generates a digital signal output corresponding to said count of said first increment and decrement signals, said second counter means having master and slave latches, said master latches of said second counter means being updated by said first timing pulse and said slave latches of said second counter means being updated by said third timing pulse.

30. A retiming circuit for synchronizing a digital input signal with a local clock, comprising:

a delay means for delaying said digital input signal which is responsive to a digital control signal wherein said digital control signal controls a delay added to said digital input a phase comparator means connected to said delay means and said local clock for comparing a phase of said local clock with a phase of said delayed input signal and generating a digital phase comparator signal which corresponds to said phase comparison; and a digital filter connected to said phase comparator and to said delay means for controlling said delay means, said digital filter generates said digital control signal for said delay means in response to said phase comparator signal, said digital filter includes a clock generator circuit, a prescaler means, a first counter means, and a second counter means, said clock generator circuit generates four timing pulses from said delayed input data signal;

said prescaler means groups a plurality of digital pulses from said phase comparator into a plurality of groups of digital pulses, each of said plurality of groups of digital pulses having four digital pulses, said prescaler generates a plurality of first increment or first decrement signals from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal, said prescaler means being updated by a fourth timing pulse from said clock generator circuit;

said first counter means coupled to said prescaler means counts said first increment and decrement pulses generated by said prescaler, said first counter means having master and slave latches, said master latches being updated by a second timing pulse generated from said clock generator circuit and said slave latches being updated from said fourth timing pulse, said second and fourth timing pulses do not overlap; and said second counter means coupled to said first counter generates a digital signal output corresponding to said count of said first increment and decrement signals, said second counter means having master and slave latches, said master latches of said second counter means being updated by said fourth timing pulse and said slave latches of said second counter means being updated by said second timing pulse.

31. A phase lock loop, comprising:

a phase comparator connected to a digital filter and a digital to analog converter, said phase comparator having a digital data input signal and a digital phase input signal from a voltage controlled oscillator, said phase comparator generates a digital phase comparator signal which corresponds to a phase difference between said digital data input signal and said digital phase input signal;

said digital filter having said digital data input signal, said phase comparator transmits said phase comparator signal to said digital filter, said digital filter generates a digital control signal from said phase comparator signal and said digital data input signal, said digital filter comprising a clock generator circuit, a prescaler, a first counter means, and a second counter means;

said clock generator circuit generates four timing pulses from said input data signal;

said prescaler means groups a plurality of digital pulses from said phase comparator into a plurality of groups of digital pulses, each of said plurality of groups of digital pulses having two digital pulses, said prescaler generates a plurality of first increment or first decrement signal from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal, said prescaler means being updated by a first timing pulse from said clock generator circuit;

said first counter means coupled to said prescaler means counts said first increment and decrement pulses generated by said prescaler, said first counter means having master and slave latches, said master latches being updated by a third timing pulse generated from said clock generator circuit and said slave latches being updated from said first timing pulse, said first and third timing pulses do not overlap;

said second counter means coupled to said first counter means generates a digital signal output corresponding to said count of said first increment and decrement signals, said second counter means having master and slave latches, said master latches of said second counter means being updated by said first timing pulse and said slave latches of said second counter means being updated by said third timing pulse;

said digital to analog converter being connected to said digital filter, said phase comparator, and said voltage controlled oscillator, said phase comparator transmits said phase comparator signal to said digital to analog converter, said digital filter transmits said digital control signal to said digital to analog converter, said digital to analog converter converts said digital control signal to an analog control signal to control said voltage controlled oscillator, said digital to analog converter transmits said analog control signal to said voltage controlled oscillator, said voltage controlled oscillator generates said digital phase input signal having a frequency corresponding to said analog control signal; and said voltage controlled oscillator transmits said digital phase input signal to said phase comparator.

32. A phase lock loop, comprising:

a phase comparator connected to a digital filter and a digital to analog converter, said phase comparator having a digital data input signal and a digital phase input signal from said voltage controlled oscillator, said phase comparator generates a digital phase comparator signal which corresponds to a phase difference between said digital data input signal and said digital phase input signal;

said digital filter having a digital data input signal, said phase comparator transmits said phase comparator signal to said digital filter, said digital filter generates a digital control signal from said phase comparator signal and said digital data input signal, said digital filter includes a clock generator circuit, a prescaler, a first counter means, and a second counter means;

said clock generator circuit for generates four timing pulses from said input data signal;

said prescaler means groups a plurality of digital pulses from said phase comparator into a plurality of groups of digital pulses, each of said plurality of groups of digital pulses having four digital pulses, said prescaler generates a plurality of first increment or first decrement signal from said plurality of groups of digital pulses, said prescaler generates an increment pulse when one of said plurality of groups of digital pulses indicates that the phase of a local clock signal leads the phase of an input data signal to said digital filter, said prescaler generates a decrement pulse when one of said plurality of groups of digital pulses indicates that the phase of said local clock signal lags the phase of said input data signal, said prescaler means being updated by a fourth timing pulse from said clock generator circuit;

said first counter means coupled to said prescaler means counts said first increment and decrement pulses generated by said prescaler, said first counter means having master and slave latches, said master latches being updated by a second timing pulse generated from said clock generator circuit and said slave latches being updated from said fourth timing pulse, said second and fourth timing pulses do not overlap;

said second counter means coupled to said first counter means generates a digital signal output corresponding to said count of said first increment and decrement signals, said second counter means having master and slave latches, said master latches of said second counter means being updated by said fourth timing pulse and said slave latches of said second counter means being updated by said second timing pulse;

said digital to analog converter being connected to said digital filter, said phase comparator, and said voltage controlled oscillator, said phase comparator transmits said phase comparator signal to said digital to analog converter, said digital filter transmits said digital control signal to said digital to analog converter, said digital to analog converter converts said digital control signal to an analog control signal to control said voltage controlled oscillator, said digital to analog converter transmits said analog control signal to said voltage controlled oscillator, said voltage controlled oscillator generates said digital phase input signal having a frequency corresponding to said analog control signal; and said voltage controlled oscillator transmits said digital phase input signal to said phase comparator.

* * * * *